United States Patent
Fu

(10) Patent No.: US 7,618,521 B2
(45) Date of Patent: Nov. 17, 2009

(54) SPLIT MAGNET RING ON A MAGNETRON SPUTTER CHAMBER

(75) Inventor: Xinyu Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 725 days.

(21) Appl. No.: 11/218,756

(22) Filed: Sep. 2, 2005

(65) Prior Publication Data
US 2006/0207873 A1   Sep. 21, 2006

Related U.S. Application Data

(60) Provisional application No. 60/663,568, filed on Mar. 18, 2005.

(51) Int. Cl.
*C23C 14/35* (2006.01)
(52) U.S. Cl. .............. 204/298.16; 204/298.17; 204/298.2; 204/298.13
(58) Field of Classification Search .............. None
See application file for complete search history.

(56) References Cited

U.S. PATENT DOCUMENTS

| | | | |
|---|---|---|---|
| 4,925,542 A * | 5/1990 | Kidd .................... | 427/531 |
| 5,415,754 A * | 5/1995 | Manley .................. | 204/192.12 |
| 6,014,943 A | 1/2000 | Arami et al. ............. | 118/723 E |
| 6,406,599 B1 * | 6/2002 | Subramani et al. ....... | 204/298.09 |
| 6,610,184 B2 | 8/2003 | Ding et al. ............. | 204/298.17 |
| 2004/0094509 A1 | 5/2004 | Miyata et al. ............ | 216/70 |

* cited by examiner

*Primary Examiner*—Nam X Nguyen
*Assistant Examiner*—Jason M Berman
(74) *Attorney, Agent, or Firm*—Law Offices of Charles Guenzer

(57) ABSTRACT

A split magnet ring, particularly useful in a magnetron plasma reactor sputter depositing tantalum or tungsten or other barrier metal into a via and also resputter etching the deposited material from the bottom of the via onto the via sidewalls. The magnet ring includes two annular magnet rings composed of the same axial polarity separated by a non-magnetic spacing of at least the axial length of one magnet and associated poles. A small unbalanced magnetrons rotates about the back of the target having an outer pole of the same polarity as the ring magnets surrounding a weaker inner pole of the opposite pole.

21 Claims, 4 Drawing Sheets

SPLIT MAGNET RING ON A MAGNETRON SPUTTER CHAMBER

RELATED APPLICATION

This application claims benefit of provisional application 60/663,568, filed Mar. 18, 2005.

FIELD OF THE INVENTION

The invention relates generally to sputtering of materials. In particular, the invention relates to auxiliary magnets used to improve uniformity in a magnetron sputter reactor.

BACKGROUND ART

Sputtering, alternatively called physical vapor deposition (PVD), is commonly used in depositing layers of metals and related materials in the fabrication of semiconductor integrated circuits. Recent technology developed for copper metallization in silicon integrated circuits has emphasized sputtering of refractory metals such as tantalum for use as a barrier layer in a interconnect hole structure etched into a dielectric and sputtering of copper for use as a seed layer for the final electroplating of copper to fill the hole. The requirements placed upon sputtering have intensified as the diameter of the interconnect hole has shrunk to below 100 nm and as the aspect ratio of holes has increased to 5 and above.

Advanced sputter reactors have been developed with complexly shaped targets and inductive power sources, which for the most part are intended to increase the ionization fraction of the sputtered atoms. Thereby, biasing of the wafer attracts the ionized sputtered atoms to deep within holes and also to sputter etch overhangs and undesired layers at the bottom of the holes. However, fairly conventional sputter reactors continue to be used even in advanced applications because of their simplicity and low cost. The conventional sputter reactor is modified with sophisticated magnetics to achieve many of the performance characteristics of the more complex sputter reactors.

Gung et al in U.S. Pat. No. 6,610,184, incorporated herein by reference, hereafter Gung, disclose a plasma sputtering reactor 10 illustrated in the schematic cross-section view of FIG. 1. A vacuum chamber 12 includes generally cylindrical sidewalls 14, which are electrically grounded. Typically, an unillustrated grounded replaceable shield and sometimes an additional floating shield are located inside the sidewalls 14 to protect them from being sputter coated, but they act as chamber sidewalls except for holding a vacuum. A sputtering target 16 having at least a surface layer composed of the metal to be sputtered is sealed to the chamber 12 through an electrical isolator 18. A pedestal electrode 22 supports a wafer 24 to be sputter coated in parallel opposition to the target 16. A processing space is defined between the target 16 and the wafer 24 inside of the shields.

A sputtering working gas, preferably argon, is metered into the chamber from a gas supply 26 through a mass flow controller 28. An unillustrated vacuum pumping system maintains the interior of the chamber 12 at a very low base pressure of typically $10^{-8}$ Torr or less. During plasma ignition, the argon pressure is supplied in an amount producing a chamber pressure of approximately 5 milliTorr, but as will be explained later the pressure is thereafter decreased. A DC power supply 34 negatively biases the target 16 to approximately −600 VDC causing the argon working gas to be excited into a plasma containing electrons and positive argon ions. The positive argon ions are attracted to the negatively biased target 16 and sputter metal atoms from the target.

The invention is particularly useful with self-ionized plasma (SIP) sputtering in which a small nested magnetron 36 is supported on an unillustrated back plate behind the target 16. The chamber 12 and target 16 are generally circularly symmetric about a central axis 38. The SIP magnetron 36 includes an inner magnet pole 40 of a first vertical magnetic polarity and a surrounding outer magnet pole 42 of the opposed second vertical magnetic polarity. Both poles are supported by and magnetically coupled through a magnetic yoke 44. The yoke 44 is fixed to a rotation arm 46 supported on a rotation shaft 48 extending along the central axis 38. A motor 50 connected to the shaft 48 causes the magnetron 36 to rotate about the central axis 38.

In an unbalanced magnetron, the outer pole 42 has a total magnetic flux integrated over its area that is larger than that produced by the inner pole 40, preferably having a ratio of the magnetic intensities of at least 150%. The opposed magnetic poles 40, 42 create a magnetic field inside the chamber 12 that is generally semi-toroidal with strong components parallel and close to the face of the target 16 to create a high-density plasma there to thereby increase the sputtering rate and increase the ionization fraction of the sputtered metal atoms. Because the outer pole 42 is magnetically stronger than the inner pole 40, a fraction of the magnetic field from the outer pole 42 projects far towards the pedestal 22 before it loops back to behind the outer pole 42 to complete the magnetic circuit.

An RF power supply 54, for example, having a frequency of 13.56 MHz is connected to the pedestal electrode 22 to create a negative self-bias on the wafer 24. The bias attracts the positively charged metal atoms across the sheath of the adjacent plasma, thereby coating the sides and bottoms of high aspect-ratio holes in the wafer, such as, inter-level vias.

In SIP sputtering, the magnetron is small and has a high magnetic strength and a high amount of DC power is applied to the target so that the plasma density rises to above $10^{10}$ cm$^{-3}$ near the target 16. In the presence of this plasma density, a large number of sputtered atoms are ionized into positively charged metal ions. The metal ion density is high enough that a large number of them are attracted back to the target to sputter yet further metal ions. As a result, the metal ions can at least partially replace the argon ions as the effective working species in the sputtering process. That is, the argon pressure can be reduced. The reduced pressure has the advantage of reducing scattering and deionization of the metal ions. For copper sputtering, under some conditions it is possible in a process called sustained self-sputtering (SSS) to completely eliminate the argon working gas once the plasma has been ignited. For aluminum or tungsten sputtering, SSS is not possible, but the argon pressure can be substantially reduced from the pressures used in conventional sputtering, for example, to less than 1 milliTorr.

An auxiliary array 60 of permanent magnets 62 is positioned around the chamber sidewalls 14 and is generally positioned in the half of the processing space towards the wafer 24. The auxiliary magnets 62 have the same first vertical magnetic polarity as the outer pole 42 of the nested magnetron 36 so as to draw down the unbalanced portion of the magnetic field from the outer pole 42. In the embodiment described in detail below, there are eight permanent magnets, but any number of four or more distributed around the central axis 38 would provide similarly good results. It is possible to place the auxiliary magnets 62 inside the chamber sidewalls 14 but preferably outside the thin sidewall shield to increase their effective strength in the processing region. However, placement outside the sidewalls 14 is preferred for overall processing results.

The auxiliary magnet array 62 is generally symmetrically disposed about the central axis 38 to produce a circularly symmetric magnetic field. On the other hand, the nested magnetron 36 has a magnetic field distribution is asymmetrically disposed about the central axis 38 although, when it is averaged over the rotation time, it becomes symmetric. There are many forms of the nested magnetron 36. The simplest though less preferred form has a button center magnetic pole 40 surround by an circularly annular outer magnetic pole 42 such that its field is symmetric about an axis displaced from the chamber axis 38 and the nested magnetron axis is rotated about the chamber axis 38. One such nested magnetron has a triangular shape with an apex near the central axis 38 and a base near the periphery of the target 16. This shape is particularly advantageous because the time average of the magnetic field is more uniform than for a circular nested magnetron.

Gung describes the effects of their magnetic elements. The unbalanced magnetron 36 creates a semi-toroidal magnetic field $B_M$ that is generally parallel to the sputtering face of the target 16 to thereby trap electrons, increase the plasma density, and hence increase the sputtering rate. Because of the imbalance, a substantial unmatched magnetic field emanates from the outer pole 42 creating both a return magnetic field $B_{A1}$, which projects into the chamber 12 near the chamber center 38 but returns to the back of the magnetron 36, and a sidewall magnetic field $B_{A2}$ near the chamber sidewall 14. The sidewall magnetic field $B_{A2}$ is drawn toward the similarly polarized auxiliary array 62 before it returns to the back of the magnetron 42. Gung describes the beneficial effects of such an arrangement as extending the plasma and guiding the ionized sputter particles towards the wafer 24. He further describes the improved radial uniformity of deposition of copper films.

The Gung configuration has been advantageously applied to copper deposition, particularly for a thin copper seed layer into a narrow via hole formed through an inter-level dielectric for forming a vertical interconnect as well as for horizontal interconnects in the commercially important dual-damascene structure. The copper seed layer is used as a seed and electroplating layer for the subsequent filling of the via hole by electrochemical plating (ECP). In this application, overhang is a considerable problem. On the other hand, when the Gung configuration is applied to sputtering a tantalum barrier layer between the walls of the via hole and the copper seed layer, the resulting uniformity was not completely satisfactory. In this barrier application, sidewall coverage and uniformity deep in the via hole is more important.

SUMMARY OF THE INVENTION

An auxiliary magnet assembly is positioned around the processing area of a plasma sputter reactor, preferably outside of the chamber wall. It includes at least two magnet rings of the same magnetic polarity separated by a spacing of non-magnetic or reduced magnetic material or space, preferably having an axial length at least as long as either of the rings and more preferably at least twice as long.

The two magnet rings are conveniently formed in a two-piece non-magnetic collar fixable together on the chamber exterior. The collar has two inwardly facing ribs with recesses for magnets. Two pairs of ring-shaped magnetic capture the magnets within the recesses and act as magnetic yokes.

A sputtering method for a metal such as a refractory metal such as tantalum, titanium, or tungsten may use the split magnet ring and the inter-ring spacing may be optimized for the process.

DETAILED DESCRIPTION OF THE PREFERRED EMBODIMENTS

Figure 2:
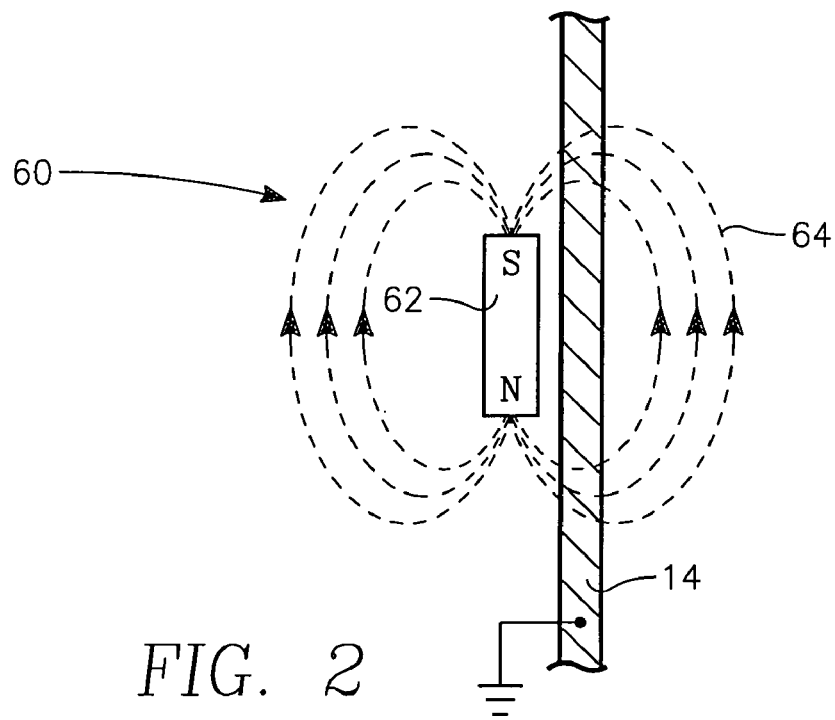
FIG. 2 is a schematic illustration of the magnetic field produced by the single magnet ring of FIG. 1.

I believe that the improved uniformity achieved by Gung is in part achieved by the magnet ring 62 producing a generally semi-toroidal magnetic field 64 that resembles a dipole field adjacent the chamber sidewall 14 or the shields on the side of the chamber away from the rotating magnetron 36 but also exists on the side of the chamber 12 temporarily aligned with the rotating magnetron 36. As shown in more detail in the schematic elevation view of FIG. 2, the magnetic field 64 produced by the magnet ring 60 is a magnet dipole field except for unimportant secondary effects due to annular form of the magnet ring 60. Inside the chamber sidewall 14, the dipole field 64 creates a magnetic barrier against the diffusion of the plasma, in particular its electrons, to the grounded chamber sidewall 14. As a result, the plasma containing the sputtered metal ions which diffuses from the target 16 near the magnetron 46 is prevented from diffusing to the grounded wall 14. Such a diffusing plasma results in a plasma that is stronger at the chamber center 38 than nearer its edge. Such a non-uniform plasma as it approaches the wafer 24 being sputter deposited and otherwise plasma processed insults in a strong radial non-uniformity on the wafer 24. With the reduced sidewall diffusion, the plasma becomes more uniform in the radial direction resulting in more uniform wafer processing.

However, the dipole field 64 suffers some disadvantages. As illustrated, it bulges inwardly into the chamber near the midline of the magnet ring 60. That is, the dipole field 64 bulges towards the chamber central axis 38 and creates a significantly concave barrier. As a result, the plasma is confined within the inwardly concave barrier and the ionized sputter particles are somewhat focused towards the center of the wafer 24, resulting in uneven sputter deposition but more particularly sputter etching of the wafer 24.

The sputter etching of the wafer 24 is particularly important for coating the sidewalls of a narrow deep via of high aspect ratio. Barrier metals such as refractory metals including titanium, molybdenum, tantalum, tungsten, cobalt, chromium, and ruthenium have reduced but significant electrical conductivity and their nitrides, which may be sputter deposited in the magnetron sputter reactor by reactive sputter, are poor conductors. If the sputter flux has a high ionization fraction and the wafer is strongly biased, the ions are drawn deep within the via to coat the bottom via sidewalls. What portion of the flux strikes and is deposited on the bottom of the via is likely to be resputtered simultaneously or subsequently and be deposited on the bottom via sidewalls. Hence, the process reduces or eliminates the barrier layer at the bottom, where it is not required against the underlying metal level, and increases the sidewall coverage.

Figure 1:
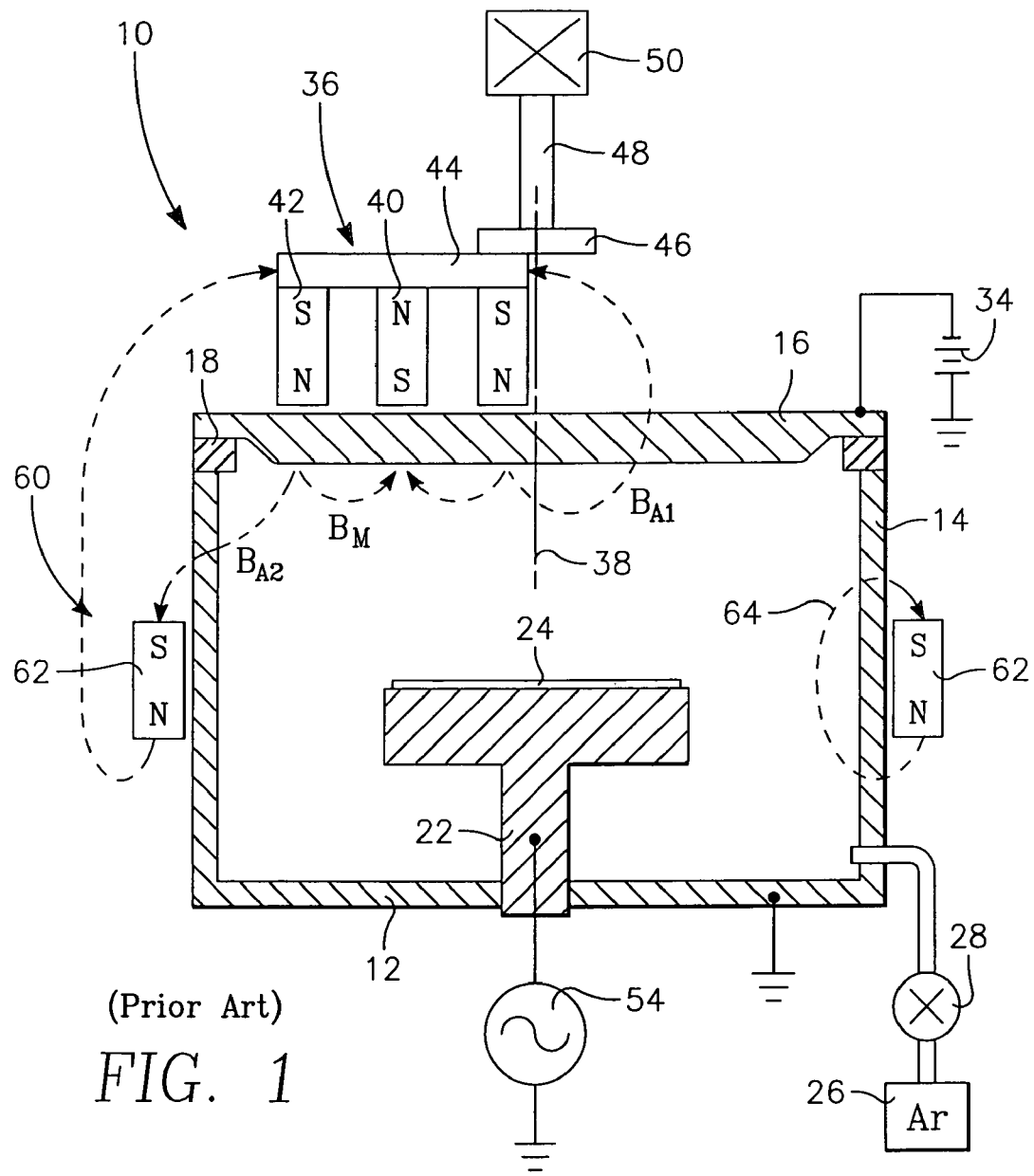
FIG. 1 is a cross-sectional view of a magnetron sputter reactor of the prior art including a single auxiliary magnet ring.

The effect of a bulging magnetic barrier seems not to not be significant for the present generation of copper sputtering (though it may become so in future generations). However, the sputtering tantalum with the configuration of FIG. 1 produces poor radial uniformity of sidewall asymmetry and bottom deposition and resputtering. Copper and tantalum are distinctly different materials. The target resputtering yield is significantly different between the two results in a significantly higher ionization fraction for copper to the extent that sustained self-sputtering is possible with copper but not tantalum. That is, for copper sputtering, after plasma ignition, the argon sputtering gas may be turned off and the sputtered copper ions will act as the sputtering gas to support the plasma. Also, the significantly different masses of copper and tantalum will produce significantly different rates of sputter etching within the vias.

Figure 3:
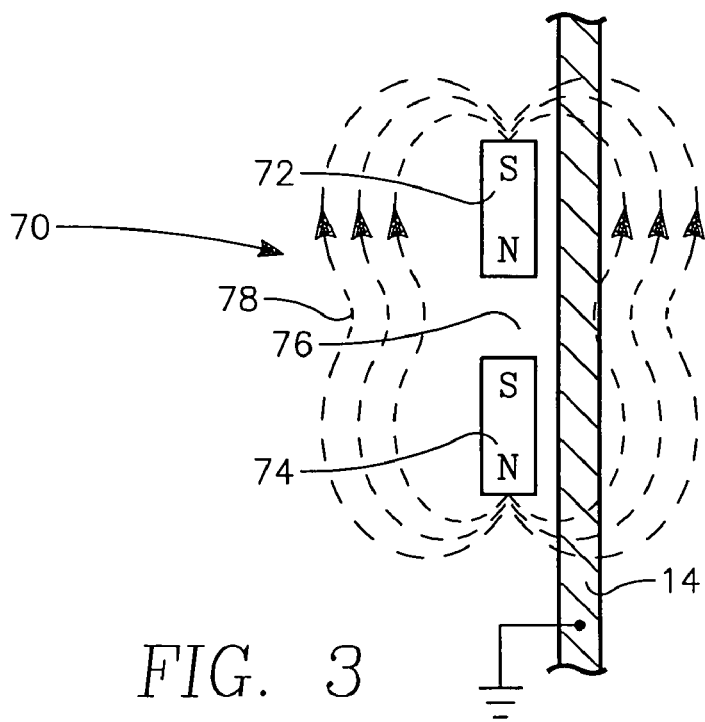
FIG. 3 is a schematic illustration of the magnetic field produced by the split magnet ring of one embodiment of the invention.

The plasma can be better confined and produce more uniform sputter deposition and etching by flattening the magnetic field adjacent the chamber sidewall 14 or associated shield. The flattening can be achieved by splitting the magnet ring into two or more magnet rings separated by space or other dielectric. As schematically illustrated in the elevational view of FIG. 3, a split magnet ring 70 includes two magnet sub-rings 72, 74 of the same polarity with a separation or axial spacing 76 that is non-magnetic or at least of substantially reduced magnetic permeability from that of the two magnet sub-rings 72, 74. Each sub-ring 72, 74 produces a respective substantially dipolar magnetic field. However, a resultant combined split ring magnetic field 78 is substantially flattened, especially on the interior of the sidewall 14, because of the non-magnetic spacing 76. As a result, the combined magnetic field 78 acts as an effective barrier adjacent the chamber sidewall 14 to prevent plasma from diffusing to the grounded sidewall 14 or shield, but with significantly reduced focusing of the plasma toward the center 38 of the chamber 12.

This configuration has the further advantage that magnetic saturation of the magnet rings 72, 74 is reduced. As a result, the average magnetic field density produced by the split magnet ring 70 is increased over what would be produced if the magnet rings 72, 74 using the same magnets were continuous or placed adjacent each other with no spacing 76 between them.

Figure 4:
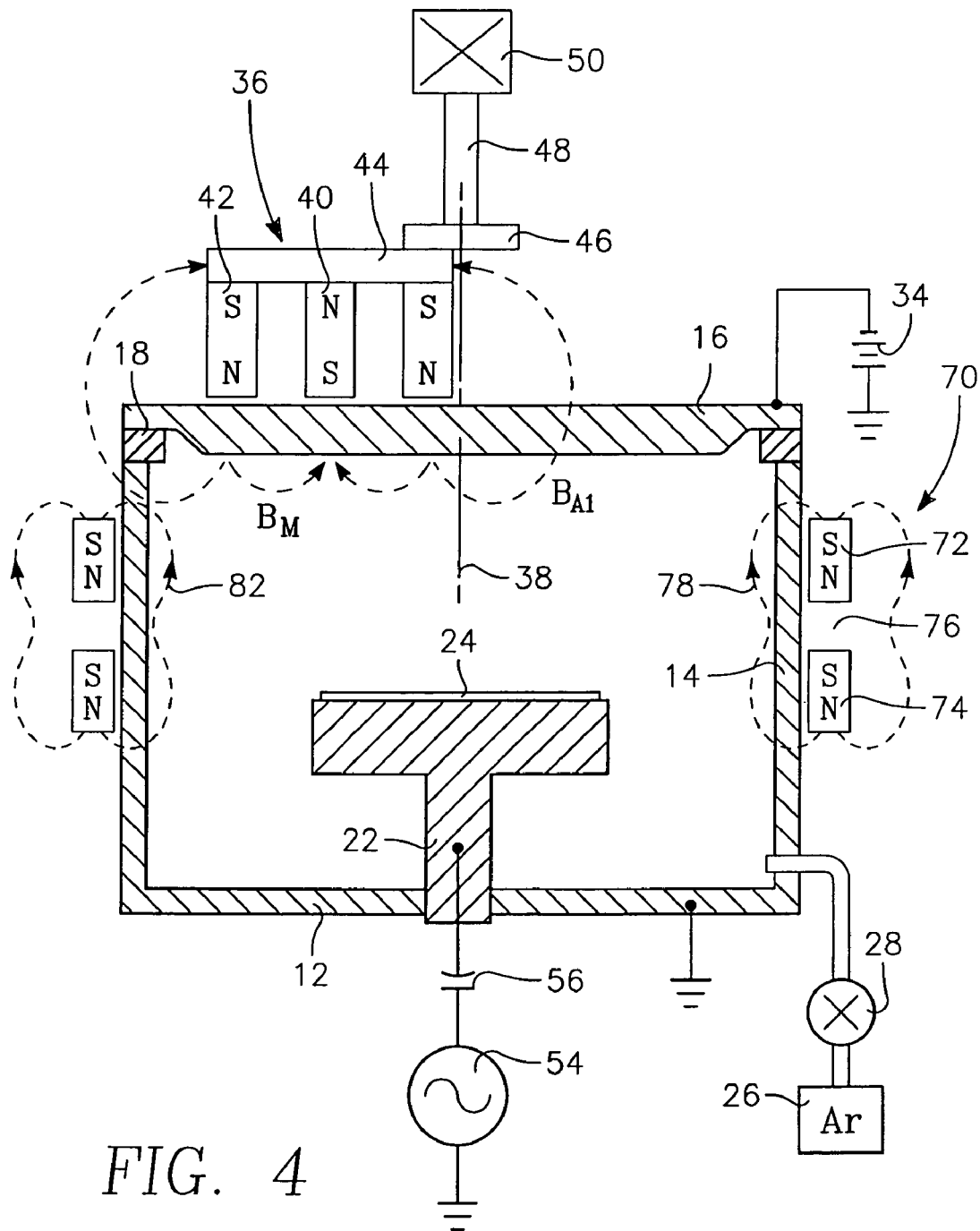
FIG. 4 is a cross-section view of magnetron sputter reactor of the invention including the split magnet ring of FIG. 3.

A sputter reactor 80 of the invention is illustrated in the schematic cross-sectional view of FIG. 4 including the split magnet ring 70. An estimated magnetic field distribution 82 underlying the unbalanced roof magnetron 36 combines the unbalanced field from the magnetron 36 and the split magnet ring 72.

The magnetron 36 is preferentially the unbalanced LDR magnetron having an arc shape of a closed plasma loop, as disclosed by Gung et al. in U.S. patent application Ser. No. 10/949,735, filed Sep. 23, 2004 and now published as U.S. Published Patent Application 2005/0211548, incorporated herein by reference. In its sputtering position, the convex side of the arc shape is close to the periphery of the target 16 so that its magnetic field is concentrated near the target periphery. The magnetron 36 can be switched by a centrifugal mechanism so the arc shape more closely aligns with the target radius to thereby clean the central portions of the target 16 between depositions.

Figure 5:
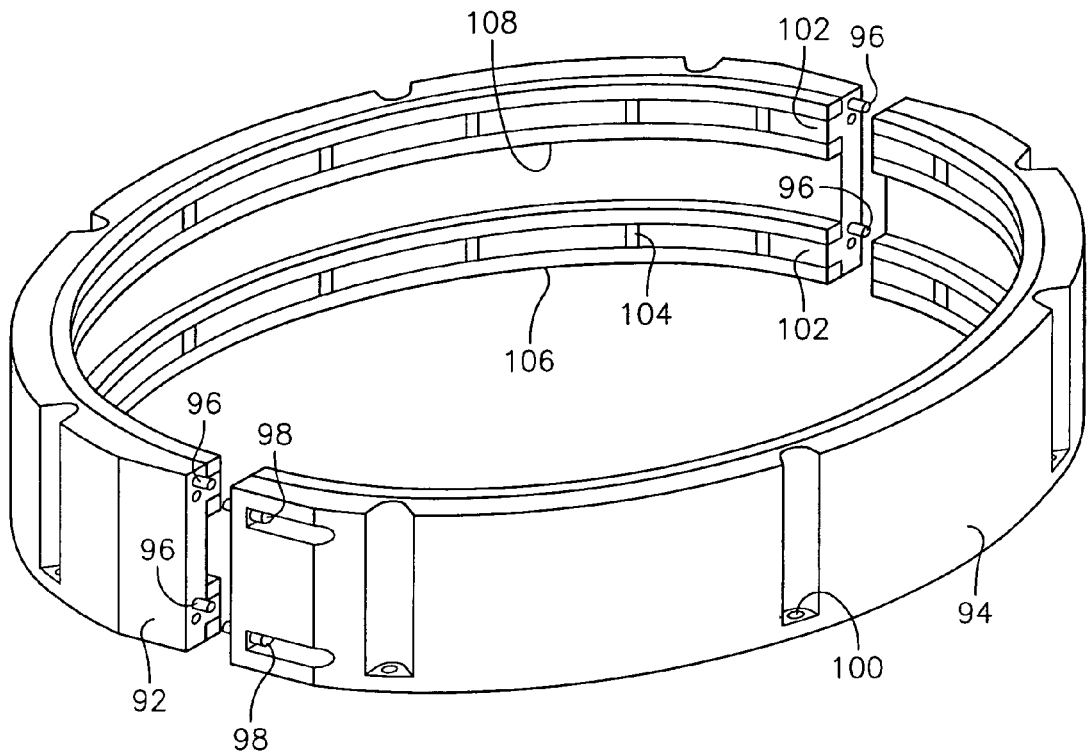
FIG. 5 is an orthographic view of a two-piece collar incorporating a split magnet ring of the invention.

A split magnet ring assembly 90 illustrated in the orthographic view of FIG. 5 includes two half collars 92, 94 composed of non-magnetic material such as aluminum. The two half collars 92, 94 can be joined together with alignment pins 96 and screws 98 around the exterior of the chamber sidewall 14 and screwed to supports on the sidewall 14 through vertical through holes 100. Each half collar 92, 94 includes two annular inwardly facing ribs 102 having recesses to accommodate a plurality, for example, eight vertically polarized rod magnets 104. Each magnet 104 has an exemplary length of about 15 cm and an exemplary diameter of 6 mm and may be composed of NdBFe. That is, there are two sets of sixteen magnets 14 (divided between the two half collars 92, 94) arranged about the central axis for a chamber configured for 300 mm wafers. The vertical spacing between the magnets 14 may be varied to optimize deposition uniformity. A typical range is 25 to 44 mm, that is, greater than the length of the individual magnets and preferably at least twice the magnet length but less than four times the magnet length, plus the thickness of the associated pole faces. Screws capture the magnets 14 on the ribs 102 through two pairs of washer-shaped holders 106 composed of magnetic material, for example, SS410 stainless steel, and disposed on opposing vertical spaced sides of the ribs 102 to act not only as holders but also as magnetic pole faces.

Figure 6:
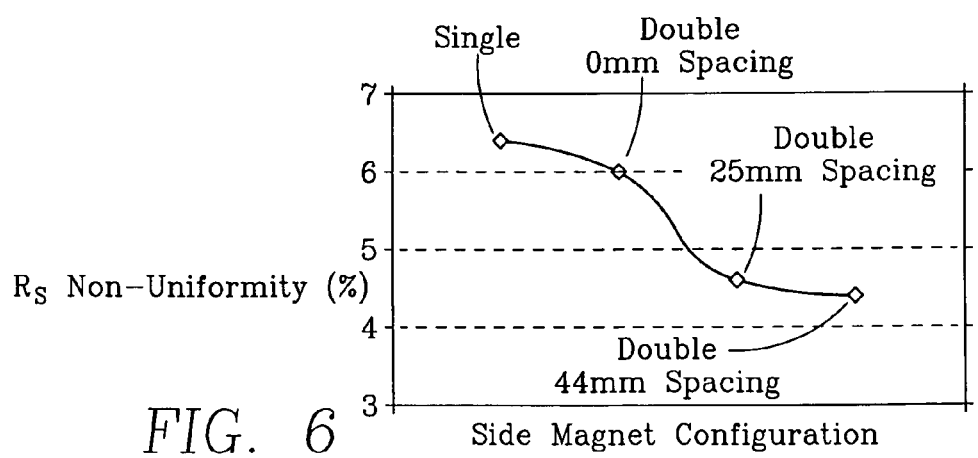
FIG. 6 is a graph illustrating the improved uniformity achievable with the invention.

In general, the sidewall magnets are effective only in the presence of significant wafer biasing, for example, 800W RF power for a 300 mm wafer, in order to resputter the tantalum deposited on the via bottom onto the lower via sidewalls. The biasing draws the ionized sputter ions also affected by the auxiliary sidewall magnets while neutral sputter atoms are primarily unaffected by either wafer biasing or sidewall magnets. Sputtering uniformity tests were performed using various ring magnets for sputtering tantalum. Sheet resistance $R_S$ was measured for a deposited tantalum film to determine the deposition uniformity across the wafer radius. As shown by the graph of FIG. 6, either a single sidewall magnet ring, as taught by Gung, or a split magnet ring with no spacing between the two rings produce about the same high non-uniformity, generally considered unsatisfactory. Split magnet rings with spacings of 25 mm and 44 mm significantly reduce the non-uniformity. Further experiments have demonstrated that the split magnet ring is effective at increasing the resputtering near the wafer edge relative to the generally higher resputtering at the wafer center.

The split magnet ring has also been applied to sputtering titanium. In this case, the spacing between the two magnet rings was reduced by 2 mm to optimize the performance. The design freedom of varying the spacing in different applications is one advantage of the split magnet ring.

It is possible to have three or more magnet sub-rings with non-magnetic spacings between them.

Although the invention has been described with reference to sputtering tantalum and titanium, it is applicable to sputtering other materials, particularly barrier metals. Experiments have shown the usefulness of the invention to sputtering tungsten.

The invention claimed is:

1. A sputter reactor, comprising:
    a vacuum chamber having sidewalls arranged about a central axis;
    a sputter target sealed to one end of the vacuum chamber;
    a pedestal arranged along the central axis in opposition to the sputter target for supporting a substrate to be processed; and
    a split magnet ring comprising permanent magnets arranged about the central axis, disposed at least partially along the central axis between the sputter target and the pedestal, and including at least two sub-rings of a first magnetic polarity along the central axis, an axial spacing along the central axis of substantially reduced magnetization being maintained between the sub-rings.

2. The sputter reactor of claim 1, wherein the axial spacing has a length at least equal to a length of one of the sub-rings along the central axis.

3. The sputter reactor of claim 2, wherein the length of the axial spacing is no more than four times the length of said one of the sub-rings.

4. The sputter reactor of claim 1, further comprising a magnetron rotatable about the central axis and disposed on a side of the sputter target opposite the pedestal.

5. The sputter reactor of claim 4, wherein the magnetron comprises an outer pole of the first magnetic polarity surround an inner pole of a second magnetic polarity opposite the first magnetic polarity, wherein a total magnetic intensity of the outer pole is substantially larger than a total magnetic intensity of the inner pole.

6. The sputter reactor of claim 1, wherein said each of the sub-rings comprises a plurality of magnets.

7. The sputter reactor of claim 6, wherein said each sub-ring additionally comprises a pair of annular magnetic members holding the magnets and acting as pole faces for the magnets.

8. The sputter reactor of claim 6, further comprising a collar arranged about an exterior of a sidewall of the vacuum chamber capturing the magnets of the sub-rings.

9. The sputter reactor of claim 8, further comprising a plurality of pairs of magnetic rings capturing opposed ends of the magnets of respective ones of the sub-rings.

10. The sputter reactor of claim 1, wherein a sputtering face of the sputtering target principally comprises one of tantalum, titanium, and tungsten.

11. A split magnet ring configured to be arranged about a sidewall of a sputter reactor and comprising at least two sub-rings fixable together to form a ring and each sub-ring comprising:
    a partial collar fixable to at least one other partial collar; and
    permanent rod magnets axially extending parallel to a central axis of the two fixed partial collars and held in the partial collar in at least two partially annular arrangements with axial spaces therebetween, a spacing between the two partially annular arrangements of magnets being at least as great as an individual length of the magnets.

12. The split magnet ring of claim 11, wherein the spacing is at least equal to the individual length and no more than four times the individual length.

13. The split magnet ring of claim 11, wherein the partial collar comprises at least two inwardly facing, circumferentially extending ribs with vertically oriented recesses therein in which the magnets are disposed.

14. The split magnet ring of claim 13, further comprising two pairs of magnetic segments disposed on opposed sides of the ribs of the two partial collars and capturing all the magnets therebetween.

15. A method of sputtering a metal onto a substrate, comprising:
    providing a vacuum chamber arranged about a central axis;
    affixing a target to the vacuum chamber comprising a surface comprising a metal;
    supporting a substrate to be processed on a pedestal electrode in opposition to the target;
    applying DC power to the target to excite a plasma within the chamber to sputter the metal from the target;
    rotating an unbalanced magnetron about the central axis at the back of the target;
    RF biasing the pedestal electrode; and
    providing a split magnet ring comprising permanent magnets surrounding the central axis in a region between the target and the pedestal electrode, wherein the split magnet ring includes two magnet rings of a first magnetic polarity along the central axis and separated by a substantially non-magnetic spacing having an axial length at least as great as axial lengths of either of the magnet rings.

16. The method of claim 15, wherein the metal is a refractory metal.

17. The method of claim 16, wherein the metal comprises tantalum.

18. The method of claim 15, wherein the unbalanced magnetron comprises an outer pole of the first magnetic polarity surrounding a weaker inner pole of an opposed second magnetic polarity.

19. The sputter reactor of claim 1, wherein the each of the magnets produces a dipolar magnetic field about itself within the respective sub-ring.

20. The sputter reactor of claim 1, wherein the axial spacing has a length of between two and five times the length of one of the sub-rings along the central axis.

21. The method of claim 15, wherein the axial length is no more than the axial lengths of either of the magnet rings.

* * * * *